United States Patent [19]

Taguchi et al.

[11] Patent Number: 5,476,320
[45] Date of Patent: Dec. 19, 1995

[54] DEVELOPER PREPARING APPARATUS AND DEVELOPER PREPARING METHOD

[75] Inventors: Satoshi Taguchi; Masumi Suetsugu; Tsutomu Nagase; Norikazu Nakagawa, all of Chiba, Japan

[73] Assignee: Sumitomo Chemical Co., Ltd., Osaka, Japan

[21] Appl. No.: 338,222

[22] Filed: Nov. 9, 1994

Related U.S. Application Data

[63] Continuation-in-part of Ser. No. 153,954, Nov. 18, 1993, abandoned.

[30] Foreign Application Priority Data

Dec. 28, 1992 [JP] Japan ..................... 4-347645

[51] Int. Cl.$^6$ .................................... B01F 15/04
[52] U.S. Cl. .................. 366/152.1; 137/3; 366/137; 366/141
[58] Field of Search .............. 366/18, 141, 142, 366/151, 152, 160, 166, 182, 161, 14, 132, 136, 137, 159, 16, 17, 152.1, 152.2, 152.3, 152.4; 137/3, 89, 91; 210/86, 219, 740

[56] References Cited

U.S. PATENT DOCUMENTS

| | | | |
|---|---|---|---|
| 4,045,342 | 8/1977 | Kuster et al. | 210/81 |
| 4,151,854 | 5/1979 | Patsko | 137/3 |
| 4,294,911 | 10/1981 | Guild | 430/326 |
| 4,423,138 | 12/1983 | Guild | 430/326 |
| 4,523,854 | 6/1985 | Beckley | 366/166 |
| 4,610,953 | 9/1986 | Hashimoto et al. | 430/331 |
| 4,654,802 | 3/1987 | Davis | 364/502 |
| 4,830,508 | 5/1989 | Higuchi et al. | 366/152 |
| 4,934,177 | 6/1990 | Cuthbertson et al. | 73/32 |
| 5,027,267 | 6/1991 | Pitts et al. | 364/46 |
| 5,071,562 | 12/1991 | Allington | 366/152 |

FOREIGN PATENT DOCUMENTS

| | | |
|---|---|---|
| 0578505 | 1/1994 | European Pat. Off. . |
| 241956 | 1/1987 | Germany . |
| 4003119 | 8/1990 | Germany . |

OTHER PUBLICATIONS

"A High Resolution Ultrasonic Densitometer," by W. B. Dress, 1983 Ultrasonics Symposium Proceedings, vol. 1, Oct. 31, Nov. 1, 2, 1983, pp. 287–290.

Database Inspec Institute of Electrical Engineers, Inspec No. 2343545 "A High Resolution Ultrasonic Densitometer," Abstract, Oct. 31, Nov. 1, 2, 1983.

Patent Abstract of Japan, vol. 8, No. 103 (E–244), p. 1540, May 15, 1984.

Patent Abstracts of Japan, vol. 17, No. 658, (P–1654), Dec. 12, 1993.

Patent Abstracts of Japan, vol. 13, No. 208, (C–596), May 16, 1989.

Patent Abstracts of Japan, vol. 14, No. 207, (P–1043) Apr. 29, 1990.

*Primary Examiner*—Robert W. Jenkins
*Attorney, Agent, or Firm*—Sughrue, Mion, Zinn, Macpeak & Seas

[57] ABSTRACT

A developer preparing apparatus for obtaining a developer containing a developer component having a definite content by mixing an undiluted developer solution containing 5 to 40% by weight of tetramethylammonium hydroxide (TMAH) and pure water, and a developer preparing method for preparing the developer using the developer preparing apparatus. The developer preparing apparatus comprising a mixing bath equipped with a means for receiving and mixing an undiluted developer solution and pure water, an ultrasonic densitometer for measuring the developer component contained in the developer in the mixing bath, a flow rate controlling means for controlling the supplying flow rate of the undiluted developer solution and/or pure water into the mixing bath by the output signal from the ultrasonic densitometer, and a storage tank for receiving and storing the developer containing the developer component having the definite content in the mixing bath.

4 Claims, 2 Drawing Sheets

DEVELOPER PREPARING APPARATUS AND DEVELOPER PREPARING METHOD

CROSS REFERENCE TO THE RELATED APPLICATION

This application is a continuation-in-part application of U.S. patent application Ser. No. 08/153,954, filed Nov. 18, 1993, entitled "DEVELOPER PREPARING APPARATUS AND DEVELOPER PREPARING METHOD", now abandoned.

FIELD OF THE INVENTION

The present invention relates to a developer preparing apparatus and a developer preparing method.

BACKGROUND OF THE INVENTION

A lithography is used to form fine patterns required for the production of LCD (Liquid Crystal Display) and LSI (Large Scale Integration), and a photoresist is used for the lithography. As the photoresist, there are a positive working type photoresist and a negative working type photoresist. Since the positive working type photoresist is particularly excellent in the dimensional accuracy and the resolving power, the positive working type photoresist is generally used.

An aqueous solution of an inorganic alkali or an organic alkali is used as a developer for the positive working type photoresist, but to prevent the occurrence of staining with an alkali metal, an aqueous organic alkali solution, in particular, an aqueous solution of tetramethylammonium hydroxide (TMAH) is suitably used and the content thereof at use is low as about 2.4% by weight. However, the content of an aqueous solution of tetramethylammonium hydroxide produced as an undiluted developer solution is usually from about 5 to 40% by weight and hence it is necessary at use to dilute the undiluted developer solution with pure water.

Now, for correctly forming fine patterns, it is important to develop the light-exposed resist with good accuracy and it is necessary for this purpose that the composition of the developer used is strictly controlled to a definite content.

Hitherto, the content and the composition of the developer are correctly controlled by a developer maker and the developer is prepared by the developer maker and supplied to users such as LSI makers and LCD makers. Considering that the content of an alkali which is the main component of the developer is about 2.4% by weight as described above but when the undiluted developer solution is obtained as an aqueous solution having a content of from about 5 to 40% by weight, there is a problem that when the developer maker supplies the diluted developer solution to users, the costs for the container and the transportation for transporting the developer from the developer maker to the users increase. To overcome this problem, the developer maker supplies the undiluted developer solution to users and users may dilute the undiluted developer solution. However, it is necessary that the content of the developer after dilution is strictly adjusted to a definite content and the developer is kept and controlled at the content, and also from the standpoint of the industrial practice, it is required to practice the above procedure quickly and with labor-saving.

Even under these circumstances, a developer preparing apparatus and a developer preparing method, which can strictly adjust the content of the developer at a definite value and keep and control the content of the developer, and also can practice the procedure quickly and with labor-saving have not yet been realized.

SUMMARY OF THE INVENTION

Under the above-described circumstances, an object of the present invention is to provide a developer preparing apparatus and a developer preparing method, which can strictly adjust the content of the developer at a definite value and keep and control the developer at the content, and also can practice this procedure quickly and with labor-saving.

As a result of various investigations to attain the object described above, the inventors have discovered that the object can be attained by the present invention as described hereinbelow.

That is, according to one embodiment of the present invention, there is provided a developer preparing apparatus for obtaining a developer containing a developer component having a definite content by mixing an undiluted developer solution containing 5 to 40% by weight of tetramethylammonium hydroxide (TMAH) and pure water containing a metal ion of not more than 0.1 ppb, an organic substance of not more than 1 ppm expressed by total carbons (TC) and a fine particle having a diameter of not less than 0.2 μm of not more than 100/ml, comprising a mixing bath equipped with a means for receiving and mixing the undiluted developer solution and the pure water, an ultrasonic densitometer for measuring the developer component contained in the developer in the mixing bath, a flow rate controlling means for controlling a supplying flow rate of the undiluted developer solution and/or the pure water into the mixing bath by the output signal from the ultrasonic densitometer, and a storage tank for receiving and storing the developer containing the developer component having the definite content in the mixing bath.

According to another embodiment of the present invention, there is provided a developer preparing method for preparing a developer containing a developer component having a definite content by mixing an undiluted developer solution containing 5 to 40% by weight of tetramethylammonium hydroxide (TMAH) and pure water containing a metal ion of not more than 0.1 ppb, an organic substance of not more than 1 ppm expressed by total carbons (TC) and a fine particle having diameter of not less than 0.2 μm of not more than 100/ml, which comprises using the above-mentioned developer preparing apparatus, supplying and mixing the undiluted developer solution and the pure water in the mixing bath, measuring the content of the developer component contained in the developer in the mixing bath by an ultrasonic densitometer, controlling the supplying flow rate of the undiluted developer solution and/or the pure water into the mixing bath by making output signal from the ultrasonic densitometer put in the flow rate controlling means to provide the developer containing the developer component of a definite content in the mixing bath, and supplying the developer into the storage tank and storing it therein.

DETAILED DESCRIPTION OF THE INVENTION

Figure 1:
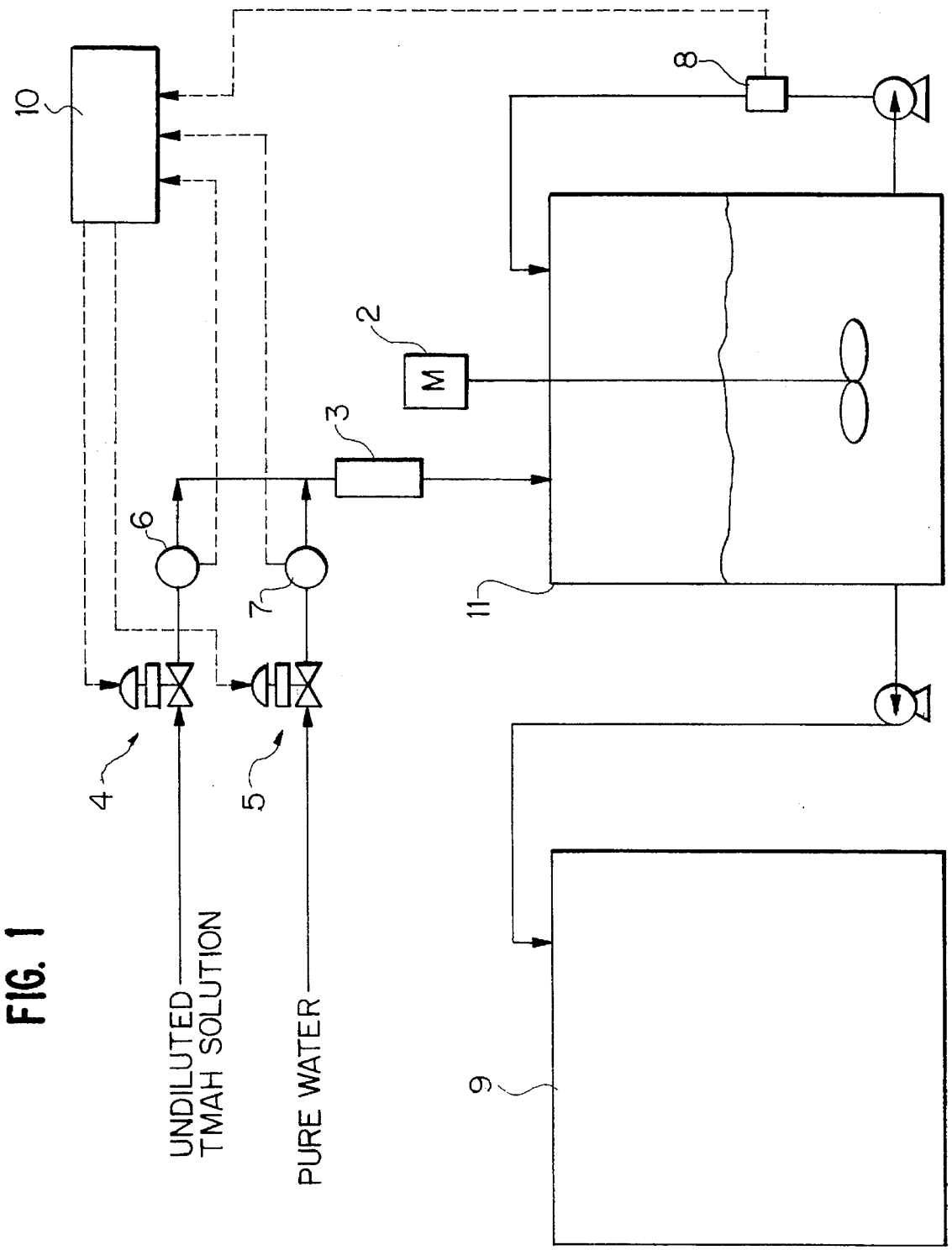
FIG. 1 is a schematic view showing the developer preparing apparatus used in Example 1.

The present invention is described in more detail below.

The developer used in the present invention is an aqueous solution of tetramethylammonium hydroxide (TMAH). In addition, the undiluted developer solution used in the present invention is obtained as an aqueous solution containing 5 to 40% by weight of TMAH as the developer component. Also, by diluting the undiluted developer solution with pure water according to the present invention, the developer a, the content of which is strictly adjusted to a definite content of about 2.4% by weight, is obtained.

Pure water which is used in the present invention is pure water containing a metal ion of not more than 0.1 ppb, an organic substance of not more than 1 ppm expressed by total carbons (TC) and a fine particle having diameter of not less than 0.2 μm of not more than 100/ml.

In the present invention, a mixing bath equipped with a means of receiving and mixing the undiluted developer solution and the pure water is used. A specific example thereof is a mixing bath having an inlet for the undiluted developer solution, an inlet for the pure water, and a stirring means.

Examples of the stirring method are a method of using a stirrer equipped to the inside of the mixing bath, a method of drawing out a part of the developer in the mixing bath by a pump and circulating it into the mixing bath again, and a method of disposing a line mixer in a circulating line in the above circulating method. Furthermore, before supplying the undiluted developer solution and the pure water into the mixing bath, they are mixed in a mixing apparatus such as a line mixer and thereafter, the mixture may be supplied into the mixing bath. This method is preferable from the standpoint that the content of the developer in the mixing bath becomes uniform.

In the present invention, an ultrosonic densitometer is used to measure the content of the developer component contained in the developer in the mixing bath. There is no particular restriction on the ultrasonic densitometer and any ultrasonic densitometer which can correctly measure the content of the developer components can be used. For example, it is preferred that the frequency used is several MHz, the liquid-contact portion is composed of SUS (stainless steel) or a fluorine resin such as TEFLON (trade name of polytetrafluoroethylene, made by E. I. du Pont de Nemours & Co., Ltd.), and the ultrasonic densitometer is equipped with a temperature-measuring portion and an ultrasonic wave transmitting and receiving portion, and also is equipped with a function capable of automatically correcting the measurement value to the temperature at measurement by the calibration curve previously obtained using a developer having a predetermined content and a temperature change compensating apparatus.

The ultrasonic densitometer used in the present invention must have a function capable of transmitting the measured value as an output signal. This is because it is necessary to control the supplying flow rate of the undiluted developer solution and/or the pure water to the mixing bath by the output signal.

The measurement terminal of the ultrasonic densitometer may be disposed in the developer in the mixing bath, may be disposed in the above-described circulation line, or may be disposed in a measuring sampling line for sampling a small amount of the developer in the mixing bath and recycling it into the mixing bath.

In the present invention, it is necessary to use a flow rate-controlling means for controlling the supplying flow rate of the undiluted developer solution and/or the pure water into the mixing bath by the output signal from the ultrasonic densitometer. There is no particular restriction on the flow rate controlling means and a means having a function of controlling the supplying flow rate of the undiluted developer solution and/or the pure water into the mixing bath in accordance with the deviation between the content of the developer component in the developer in the mixing bath obtained as the output signal from the ultrasonic densitometer and the desired content of the developer component may be used. Also, by providing a load cell for detecting the weight of the developer in the mixing bath with the bath and by controlling the supplying flow rate of the undiluted developer solution and/or the pure water into the mixing bath based on the weight signal thereof and the deviation described above, a more precise and quick automatic preparation of the developer becomes possible.

Further, it is possible to control amounts of the undiluted developer solution and/or the pure water supplied into the mixing bath by providing measuring pots with the supplying lines of the undiluted developer solution and the pure water, and using an output signal from a load cell arranged in the measuring pot.

In the present invention, the developer in the mixing bath, the developer having the developer component (TMAH) of the definite content obtained by the method described above, is stored in the storage tank and, if necessary, is taken out from the storage tank for use.

In addition, the portions of the apparatus of the present invention which are contacted with the undiluted developer solution, the pure water, and the developer are preferably composed of a fluorine resin such as TEFLON (i.e., polytetrafluoroethylene), etc., a polyolefin series resin, or a material coated with the above-described resin to prevent the entrance of a metal into the developer as an impurity.

The present invention is described practically by the following examples.

EXAMPLE 1

The apparatus shown in FIG. 1 was used.

A mixing bath (1) having a volume of 1 m$^3$ and having a stirrer (2) was prepared. The inside portion of the mixing bath and the stirrer of the portion contacted with the developer were all made by TEFLON (i.e., polytetrafluoroethylene). Each supplying line of the undiluted developer solution and pure water was a TEFLON (i.e., polytetrafluoroethylene) pipe and both the lines were united with each other before entering the mixing bath and thereafter, the united line was connected to the mixing bath through a line mixer (3). Each of the supplying lines of the undiluted developer solution and the pure water into the mixing bath was equipped with each flow rate control valve (4), (5) as a flow rate controlling means for controlling the flow rate and each flow rate control valve could control the flow rate of the undiluted developer solution or the pure water by the output signal from the ultrasonic densitometer. Further, flow rate measuring devices (6) and (7) were disposed after the control value in each supplying line. Output signals can be obtained from those devices. The ultrasonic densitometer (8) is disposed in the line for taking out a part of the developer in the mixing bath and the developer after measuring the content thereof was recycled into the mixing bath. Also, an outlet line was equipped to the mixing bath, whereby the developer thus prepared could be sent to the storage tank (9).

As the undiluted developer solution, an aqueous solution of about 15% by weight of tetramethylammonium hydroxide (TMAH) was used. The pure water used was pure water containing a total content of all metal ions of 0.03 ppb, the total carbon content of 0.2 ppm, and fine particles having a diameter of not less than 0.2 µm of 30/ml. After mixing the undiluted developer solution and pure water by the above-described line mixer, the mixture was supplied into the mixing bath. Also, the stirrer of the mixing bath was rotated and the mixture supplied in the mixing bath was also sufficiently stirred and mixed in the mixing bath.

A part of the developer in the mixing bath was sent to the line in which the ultrasonic densitometer was disposed, wherein the content of tetramethylammonium hydroxide (TMAH) in the developer was measured and at the same time, the output signal from the ultrasonic densitometer and the output signal from the flow rate measuring device were sent to the flow rate controlling means of each of the supplying lines of the undiluted developer solution and pure water through a controller (10), and by automatically controlling the open extent of the flow rate control valves, the flow rates of the undiluted developer solution and the pure water were controlled.

As a result thereof, the content of the developer in the mixing bath was maintained at 2.381% by weight for the practiced time of 30 minutes and over the total prepared amount of 0.8 m$^3$, which showed that the developer could be prepared within an error of 0.04 % to the desired content of 2.380% by weight. Furthermore, it was confirmed that during the procedure, the operation was all automated and thus the method of the present invention was very excellent in the point of lavor-saving.

EXAMPLE 2

Figure 2:
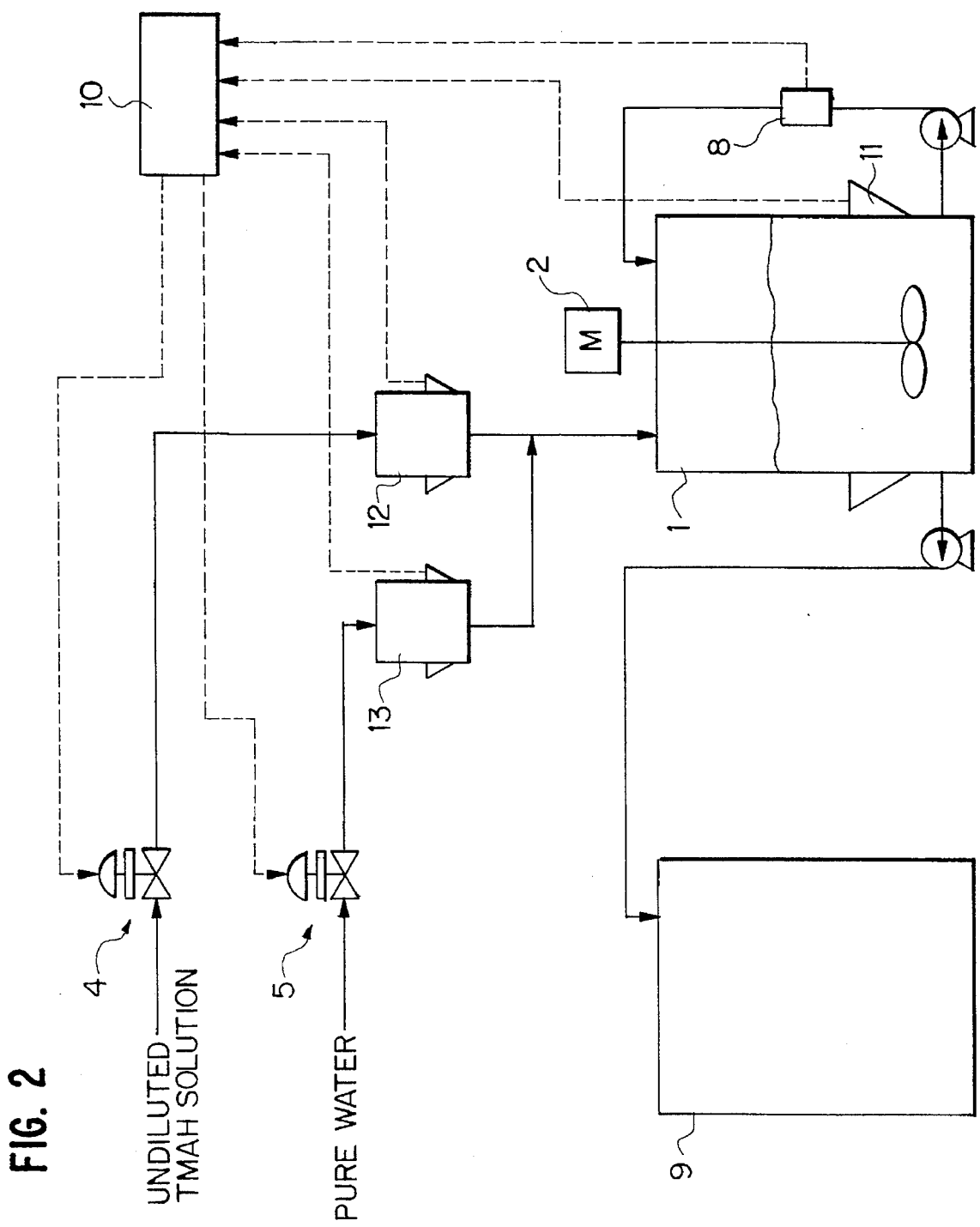
FIG. 2 is a schematic view showing the developer preparing apparatus used in Example 2.

The apparatus shown in FIG. 2 was used.

A mixing bath (1) having a volume of 1 m$^3$ and having a stirrer (2) and a load cell (11) was prepared. The inside portion of the mixing bath and the stirrer of the portion contacted with the developer were all made of TEFLON (i.e., polytetrafluoroethylene). Each supplying line of the undiluted TMAH solution and pure water was a TEFLON (i.e., polytetrafluoroethylene) pipe and both the lines were united with each other before entering the mixing bath. Measuring pots (12) and (13) each equipped with a load cell of 20L were disposed in the lines, respectively, before uniting those lines, and control valves (4) and (5) were disposed at the upstream side of the respective measuring pots. The control valve could control the flow rate by the output signal from a controller (10). An ultrasonic densitometer (8) was disposed in the line for taking out a part of the developer in the mixing bath and the developer after measuring was recycled into the mixing bath. A discharge line from the mixing bath was disposed, so that the developer thus prepared could be sent to a storage tank (9).

About 20 wt % aqueous solution of TMAH was used as the undiluted developer solution. The pure water used was pure water containing a total content of all metal ions of 0.02 ppb, the total carbon content of 0.2 ppm, and fine particles having a diameter of not less than 0.2 µm of 25/ml. The undiluted TMAH solution and the pure water were supplied into the mixing bath in substantially the same mixing ratio as predetermined, and the stirrer of the mixing bath was rotated to sufficiently mix the mixture.

After 30 minutes, a part of the developer in the mixing bath was sent to the line in which the ultrasonic densitometer was disposed, and the content of TMAH in the developer was measured. The output signal from the load cell disposed in the mixing bath and the output signal from the ultrasonic densitometer were sent to the control valve via the controller. Since the TMAH content in the mixing bath was slightly high, a valve for the pure water was opened, and a predetermined amount of the pure water was flown into the measuring pot. After 30 minutes after supplying the pure water in the measuring pot into the mixing bath, the developer in the mixing bath became uniform, and a developer having the TMAH content of 2.380% by weight which was the desired TMAH content was obtained.

As described above, according to the present invention, a developer preparing apparatus and a developer preparing method, which can strictly prepare the developer at a definite value and keep and control the developer at the content, and also can practice the operation quickly and with labor-saving, can be provided.

While the invention has been described in detail and with reference to specific embodiments thereof, it will be apparent to one skilled in the art that various changes and modifications can be made therein without departing from the spirit and scope thereof.

What is claimed is:

1. A developer preparing apparatus for obtaining a developer comprising a mixture of an undiluted developer solution containing 5 to 40% by weight of tetramethylammonium hydroxide, pure water containing a metal ion of not more than 0.1 ppb, an organic substance of not more than 1 ppm expressed by total carbons, and a fine particle having a diameter of not less than 0.2 µm of not more than 100/ml, said apparatus comprising:

a mixing bath equipped with a means for receiving and mixing the undiluted developer solution and the pure water, an ultrasonic densitometer for measuring the developer in the mixing bath, a flow rate controlling means for controlling a supplying flow rate of the undiluted developer solution and/or the pure water into the mixing bath by an output signal from the ultrasonic densitometer, and a storage tank for receiving the developer from the mixing bath and for storing the developer.

2. The developer preparing apparatus of claim 1, which further comprises a load cell for detecting a weight of the developer in the mixing bath.

3. A developer preparing method for preparing a developer comprising a mixture of an undiluted developer solution containing 5 to 40% by weight of tetramethylammonium hydroxide, pure water containing a metal ion of not more than 0.1 ppb, an organic substance of not more than 1 ppm expressed by total carbons, and a fine particle having a diameter of not less than 0.2 µm of not more than 100/ml; comprising the steps of:

supplying and mixing the undiluted developer solution and the pure water in a mixing bath, measuring the content of the developer in the mixing bath by an ultrasonic densitometer, controlling a supplying flow rate of the undiluted developer solution and/or the pure water into the mixing bath by an output signal which is sent from the ultrasonic densitometer to a flow rate controlling means to provide the developer in the mixing bath, supplying the developer into a storage tank, and storing the developer in the storage tank.

4. The developer preparing method of claim 3, wherein the supplying flow rate is further controlled by an output signal which is sent from a load cell to the flow rate controlling means.

* * * * *